United States Patent [19]

Ahn

[11] Patent Number: 5,410,562
[45] Date of Patent: Apr. 25, 1995

[54] STRAINED QUANTUM WELL SEMICONDUCTOR LASER DIODE

[75] Inventor: Do Y. Ahn, Anyang, Rep. of Korea

[73] Assignee: Gold Star Co. Ltd., Seoul, Rep. of Korea

[21] Appl. No.: 46,451

[22] Filed: Apr. 13, 1993

[30] Foreign Application Priority Data

Apr. 13, 1992 [KR] Rep. of Korea ............... 6125/1992

[51] Int. Cl.[6] .............................................. H01S 3/19
[52] U.S. Cl. .................................................... 372/45
[58] Field of Search ............................. 372/44, 45, 46

[56] References Cited

U.S. PATENT DOCUMENTS

| | | | |
|---|---|---|---|
| 5,079,774 | 1/1992 | Mendez et al. | 372/27 |
| 5,090,790 | 2/1992 | Zucker | 385/130 |
| 5,212,704 | 5/1993 | Chen et al. | 372/46 |
| 5,257,276 | 10/1993 | Forouhar et al. | 372/46 |

Primary Examiner—James W. Davie
Attorney, Agent, or Firm—John P. White

[57] ABSTRACT

A visible wavelength InGaP/InGaAlP semiconductor laser diode with a double hetero (DH) structure capable of shortening the wavelength having a compound semiconductor substrate of a first conductivity type; a compound semiconductor first clad layer of the first conductivity type formed over the substrate; an undoped compound semiconductor active layer formed over the first clad layer, the lattice constant of the active layer being different from the clad layer to tensile strain the active layer; a compound semiconductor second clad layer of a second conductivity type formed over the active layer, the lattice constant of the second clad layer is the same as that of the first clad layer; a compound semiconductor current confining layer of the first conductivity type formed over the second clad layer except for a central region such that current in the central region flows parallel to the growth direction; a compound semiconductor cap layer of the second conductivity type formed over the current confining layer; a first electrode formed over the central portion of the cap layer; and a second electrode formed on the lower surface of the substrate.

10 Claims, 5 Drawing Sheets

STRAINED QUANTUM WELL SEMICONDUCTOR LASER DIODE

BACKGROUND OF THE INVENTION

The present invention relates to a semiconductor laser diode, and more particularly to a semiconductor laser diode based on InGap/InAlGaP which is capable of shortening the wavelength of visible ray lasers.

Lasers can be generally classified into solid state lasers, gas lasers, liquid lasers and semiconductor lasers in accordance with the medium used.

Also, lasers can be largely classified into ultraviolet rays lasers, infrared rays lasers and visible ray lasers in accordance with the wavelength of the output ray.

Also, semiconductor lasers can be largely classified into semiconductor lasers based on GaAlAs which are oscillating at a wavelength range of 0.7–0.9 μm and used for communication utilizing optical fibers, semiconductor lasers based on InGaAsP which are oscillating at a long wavelength range of 1.1–16 μm and semiconductor lasers which are oscillating at a short wavelength region of 0.7 μm and are used as an emitting source for processing optical information of laser printers, compact discs and video optical discs, in addition to using such semiconductor lasers for communication.

In general, semiconductor laser diodes of visible wavelength are widely used as emitting sources of optical-magnetic discs and bar code readers and have an wavelength of about 670 nm. FIG. 1 shows a sectional view of a conventional semiconductor laser based on InGaP/InGaAlP.

Referring to FIG. 1, a n-type GaAs substrate 1 is prepared. Over the n-type GaAs substrate 1 is formed a n-type clad layer 2 which has a thickness of 2–3 μm. The n-type clad layer 2 is made of $In_{0.5}(Al_{0.7}Ga_{0.3})_{0.5}P$.

Over the n-type clad layer 2 is formed an active layer 3 which has a thickness of 0.1 μm and is doped with no impurity ions. The undoped active layer 3 is made of $Ga_{0.5}In_{0.5}P$. Over the active layer 3, a p-type clad layer 4 having a thickness of 2–3 μm is formed which is made of $In_{0.5}(Al_{0.7}Ga_{0.3})_{0.5}P$, similar to the n-type clad layer 2.

Over the p-type clad layer 4, a n-type GaAs layer is subjected to an etching process, thereby making a stripe cavity for confining current in the n-type GaAs layer. The n-type clad layer 2, the undoped active layer 3, the p-type clad layer 4 and the n-type GaAs layer are all formed by using a Molecular Beam Epitaxy method or Metal organic chemical vapour deposition method. The n-type GaAs layer having the stripe cavity serves as a current confinement layer 5. Over the current confinement layer 5, a p-type GaAs cap layer 6 is formed.

Finally, a p-type electrode 7 is formed at the upper surface of the p-type GaAs cap layer 6 and a n-type electrode 8 is formed at the lower surface of the n-type GaAs substrate 1. The semiconductor laser diode shown in FIG.1 has a double hetero (DH) structure in which the oscillating GaAs active layer 3 is positioned between the n-type clad layer 2 made of $In_{0.5}(Al_{0.3}Ga_{0.7})_{0.5}P$ and the p-type clad layer 4 made of $In_{0.5}(Al_{0.3}Ga_{0.7})_{0.5}P$.

That is, according to a semiconductor laser diode having a DH structure, the GaInP active layer 3 having a small energy band gap is enclosed by the n-type InAlGaP clad layer 2 and the p-type InAlGaP clad layer 4 having an energy band gap larger than that, respectively.

FIG. 2a to FIG. 2c are energy band diagrams showing relations between the n-type InAlGaP clad layer 2, the undoped InGaP active layer 3 and the p-type InAlGaP clad layer 4. The conventional semiconductor laser diode shown in FIG. 1 has an energy band structure shown in FIG. 2b under an equilibrium state.

As shown in FIG. 2c, if a high forward bias is applied to this semiconductor laser diode, electrons from the n-type clad layer 2 and holes from the p-type clad layer 4 are injected into the active layer 3.

As a result, energy barriers are formed by the n-type clad layer 2 and the p-type clad layer 4, thereby causing the injected electrons and holes to be confined in the active layer 3.

As shown in FIG. 2c, more carriers(electrons and holes) are distributed at a higher energy level than a lower energy level as a high forward bias is applied to the semiconductor laser diode.

This distribution is called an inversion distribution or a population inversion.

Therefore, an inversion distribution of electrons and holes is formed in the active layer 3 and electrons and holes are recoupled together.

At such an inversion distribution, light is inducibly emitted by virtue of the electron-hole recouping the inducible emission of light is called a stimulated emission.

However, since the active layer 3 of the conventional semiconductor laser diode having a DH structure is thickly deposited with a thickness of about 1 μm, the containing-rate of Indum(In) in the active layer 3 should be restrained to 0.5, so as to achieve a lattice-matching.

As above mentioned, since the wave length is restrained to 670–690 nm, the conventional semiconductor laser diode has a disadvantage in that the quantity of information to be recorded is limited when the conventional semiconductor laser is used to record information on an optical-magnetic disc.

So as to obtain a shorter wavelength of laser in the visible wavelength-semiconductor laser diode of FIG. 1 having a DH structure, a compound semiconductor such as InAlGaP may be used in place of a compound semiconductor such as InGaP, as a material of the active layer 3.

In this case, the wavelength of laser can be shortened up to 630 nm.

However, a band distance between the active layer 3 and the clad layer 2 λ becomes narrow, thereby causing leakage current to be increased and moreover causing temperature characteristic to be deteriorated.

SUMMARY OF THE INVENTION

Therefore, an object of the invention is to eliminate the above-mentioned disadvantages encountered in the prior arts and to provide a visible wavelength-semiconductor laser diode based on InGaP/InAlGaP which is capable of shortening the wave length of the laser as compared with that of the conventional semiconductor laser diode, also reducing a threshold current and simultaneously obtaining a high optical gain.

In accordance with the present invention, this object can be accomplished by providing a semiconductor laser diode comprising;

a compound semiconductor substrate of a first conductivity type;

a first compound semiconductor layer of the first conductivity type as a clad layer formed over the semiconductor substrate;

a second compound semiconductor layer which is undoped to serve as an active layer and formed over the first compound semiconductor layer, the second compound semiconductor layer having a lattice constant different from that of the first compound semiconductor layer such that the active layer can be tensile-strained up to a few percent;

a third compound semiconductor layer of a second conductivity type formed over the second compound semiconductor layer to serve as a clad layer, the third compound semiconductor layer having a lattice constant the same as that of the first compound semiconductor layer;

a fourth compound semiconductor layer of the first conductivity type as a current confining layer with the central region etched away vertically in the growth direction current flow is mainly in the center of the layer parallel to the growth direction a fifth compound semiconductor layer of the second conductivity type as a cap layer formed over the fourth compound semiconductor layer;

a first electrode formed merely over an established central portion of the whole surface of the fifth compound semiconductor layer; and a second electrode formed at the lower surface of the compound semiconductor substrate.

BRIEF DESCRIPTION OF THE DRAWINGS

Other objects and aspects of the invention will become apparent from the following description of an embodiment with reference to the accompanying drawings in which.

DETAILED DESCRIPTION OF THE PREFERRED EMBODIMENT

Figure 3:
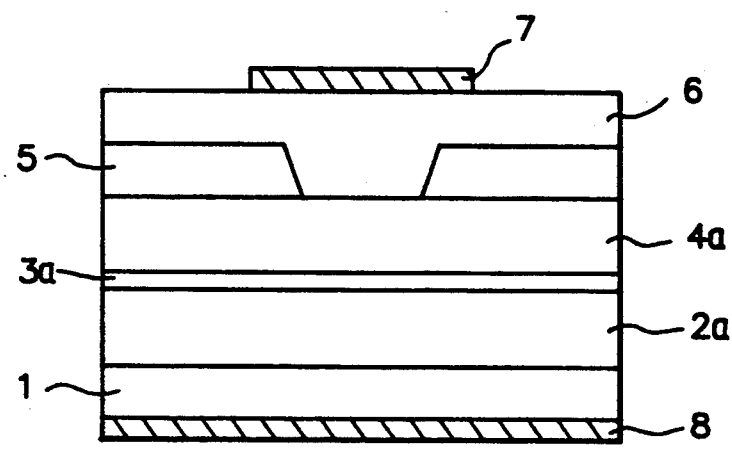
FIG. 3 is a sectional view of a semiconductor laser diode in which the oscillating wave length is shortened in accordance with an embodiment of the present invention.

FIG. 3 is a diagram showing the sectional structure of a semiconductor laser diode in accordance with an embodiment of the present invention.

The semiconductor laser diode according to the present invention is a laser diode having a DH structure, based on InGaP/InAlGaP.

Referring to FIG. 3, an $In_xGa_{1-x}P$ active layer $3a$ which is not doped with any impurity is formed over a n-type GaAs substrate 1.

The active layer $3a$ is formed with a quantum well layer having about a thickness of hundreds of Å.

A n-type $In_y(Al_zGa_{1-z})_{1-y}P$ clad layer $2a$ and a p-type $In_y$ $In_y(Al_zGa_{1-z})_{1-y}P$ clad layer $4a$ are formed at the upper surface and the lower surface of the active layer $3a$, respectively. Over the p-type clad layer $4a$, n-type GaAs current confining layer 5 and a p-type GaAs cap layer 6 are formed in this order.

A n-type electrode 7 and a p-type electrode 8 are formed over the lower surface of the n-type GaAs substrate 1 and the upper surface of the p-type GaAs cap layer 6, respectively.

In the n-type $In_y(Al_zGa_{1-z})_{1-y}P$ clad layer $2a$, the p-type $In_y(Al_zGa_{1-z})_{1-y}P$ clad layer $4a$ and $In_xGa_{1-x}P$ active layer $3a$ which is not doped with any impurity, x denotes the content (or fraction) of In atoms in the active layer $3a$, y denotes the content of In atom in the clad layers $2a$, $4a$ and z denotes the content of Al atom in the clad layers $2a$, $4a$.

In a semiconductor laser diode, a compound semiconductor layer having a thin thickness of not more than hundreds of Å is called a quantum well layer.

The quantum well layer may be formed with a single layer or a plurality of layers(namely, multi-quantum well layer), in a semiconductor laser diode.

In the semiconductor laser diode according to this invention, the active layer $3a$ made of $In_xGa_{1-x}P$ is formed with a single quantum well layer.

The content of In in the clad layers $2a$, $4a$ made of $In_y(Al_zGa_{1-z})_{1-y}P$ is larger than the content $x$ of In in the undoped active layer made of $In_xGa_{1-x}P$.

Figure 1:
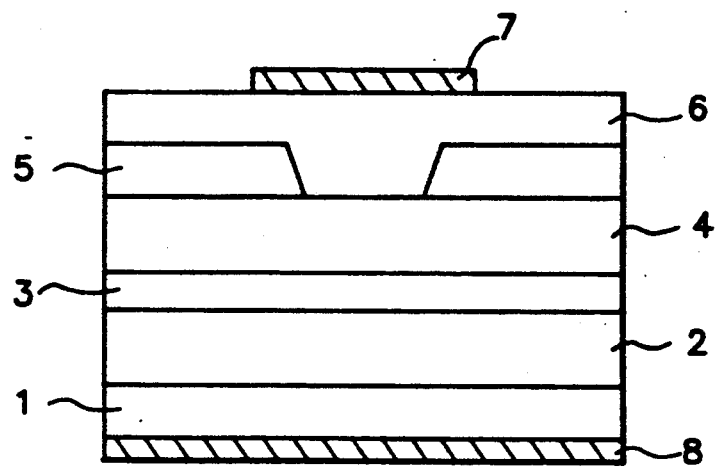
FIG. 1 is a sectional view of a conventional semiconductor laser diode.
Figure 2A:
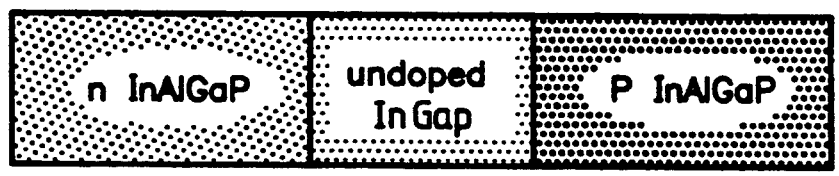
FIG. 2a to 2c are diagrams showing energy bands of the semiconductor laser diode shown in FIG. 1.
Figure 2B:
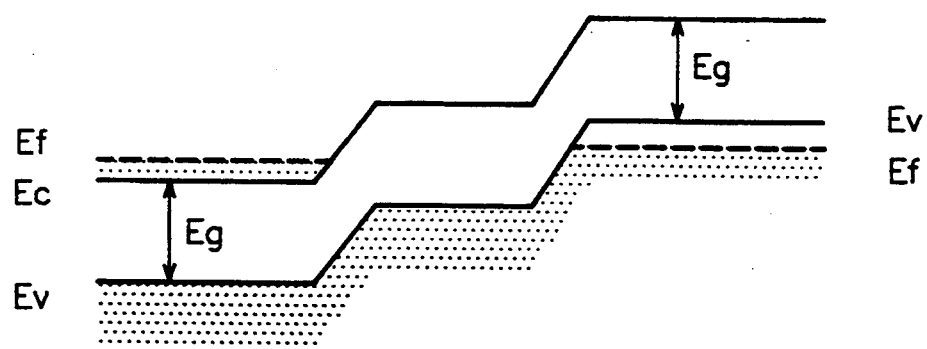
Figure 2C:
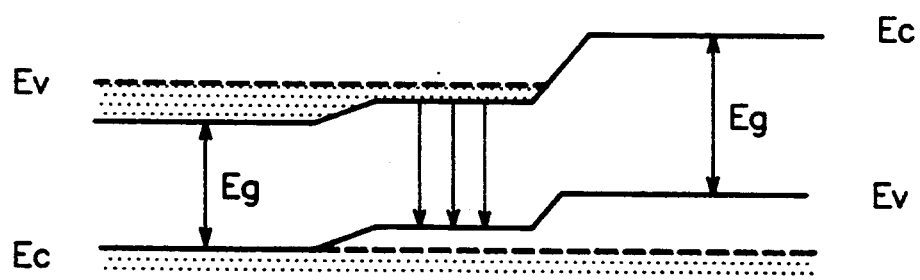

Similar to FIG. 1, therefore, the clad layer $2a$, $4a$ and the active layer $3a$ are formed as InGaAlP and InGaP, so that the energy gap between the active layer $3a$ and the clad layers $2a$, $4a$ in FIG. 3 is same as the energy gap between the active layer 3 and the clad layers 2,4, in the semiconductor laser diode shown in FIG. 1.

According to this invention, simultaneously, since the content x of In in the active layer $3a$ is smaller than the content y of In in the clad layers $2a$, $4a$, the interval between atoms in the active layer $3a$ is smaller than the interval between atoms in the clad layers $2a$, $4a$.

As above mentioned, the state that the interval between atoms in the active region is smaller than the interval between atoms in the clad layers is called a tensile-strain state. Accordingly, this invention forms a quantum well layer having the tensile-strain state, as the active layer.

Therefore a lattice-mismatching is occurs between the active layer $3a$ and the clad layers $2a$, $4a$, thereby causing the active layer $3a$ to be stressed.

In a case that the clad layers $2a$, $4a$ are fixed to $In_y(Al_{0.3}Ga_{0.7})_{1-y}P$ so as to make the clad layers $2a$, $4a$ to the largest energy barrier, respectively, the content x of In in the active layer $3a$ made of $In_xGa_{1-x}P$ should be smaller than the content of In in the clad layers $2a$, $4a$, so as to make the active layer $3a$ to the tensile-strain state.

Figure 4:
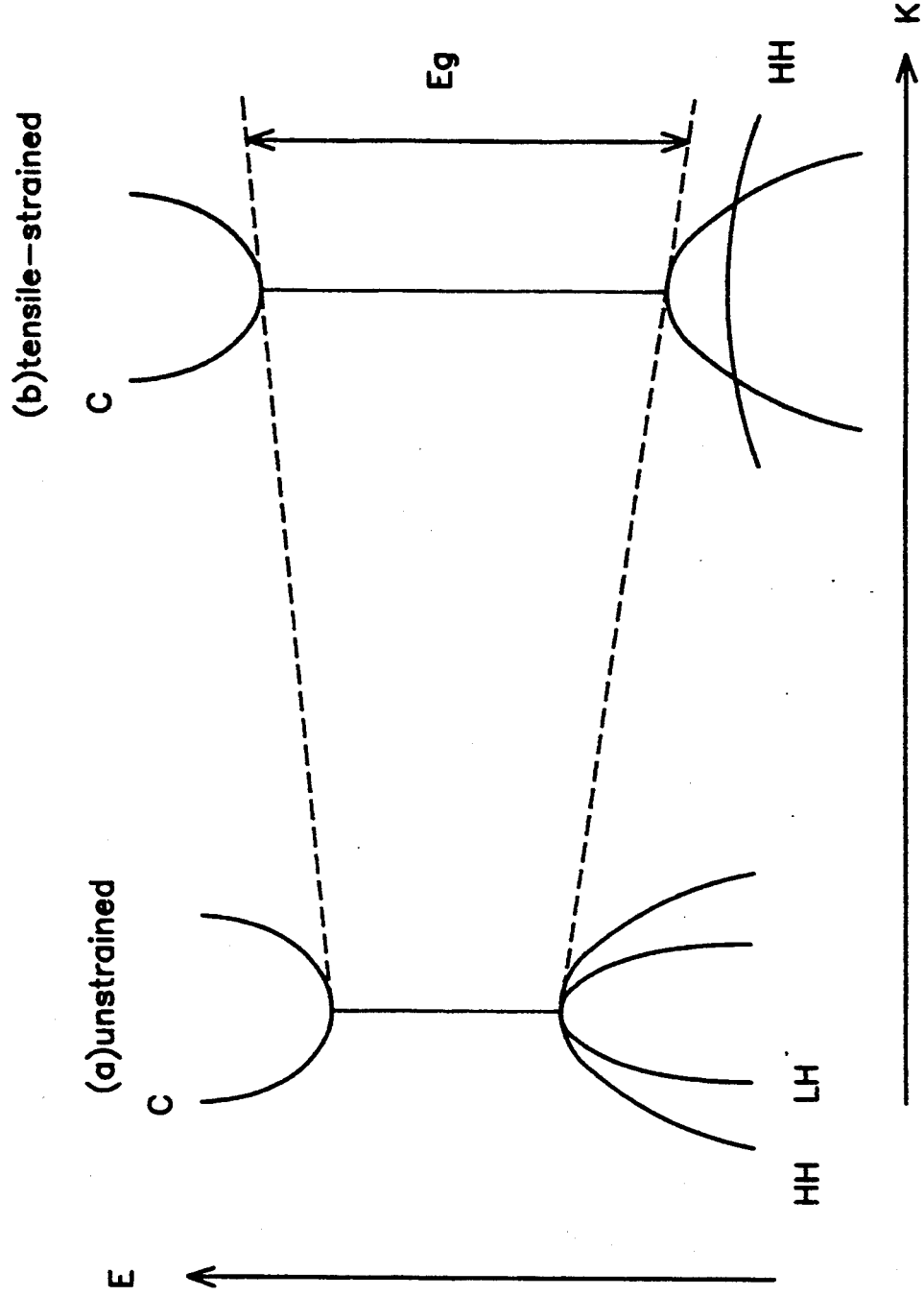
FIG. 4 is a diagram showing an energy band in an active layer of an semiconductor laser diode in accordance with the present invention.

According to an embodiment of this invention, that is, the content y of In in the clad layers $2a$, $4a$ is 0.5, the content z of Al in the clad layers $2a$, $4a$ is 0.3 to 0.7, the content x of In in the active layer $3a$ is 0.3 to 0.4 and the thickness of the active layer $3a$ is 40 Å to 200 Å such that the quantum well width is within the critical thickness. FIG. 4 is a diagram showing energy bands in the active layer of the semiconductor laser diode according to the invention. Referring to FIG. 4, the energy band structure in the active layer is varied in accordance with the strained state, and the active layer $3a$ formed of the quantum well having the tensile-strained state has a larger energy gap than that of the active layer 3a formed of the quantum well having the unstrained state.

The oscillation wave length λ of laser may be represented by the following equation (1).

$$\lambda = 1.24/E_g \quad (1)$$

As shown in the equation (1), since the oscillation wave length λ of the laser is reversely proportional to the band gap $E_g$, the band gap of the active layer formed of the quantum well having the tensile strained state is increased as shown in FIG. 4, thereby shortening the oscillation wave length of the semiconductor laser diode.

For example, the semiconductor laser diode has the short wave length of 580 nm, in a case that the active layer 3a has the width of 70 Å, is made of $In_{0.4}Ga_{0.6}P$ and the clad layer is made of $In_{0.5}(Al_{0.7}Ga_{0.3})_{0.5}P$.

Figure 5:
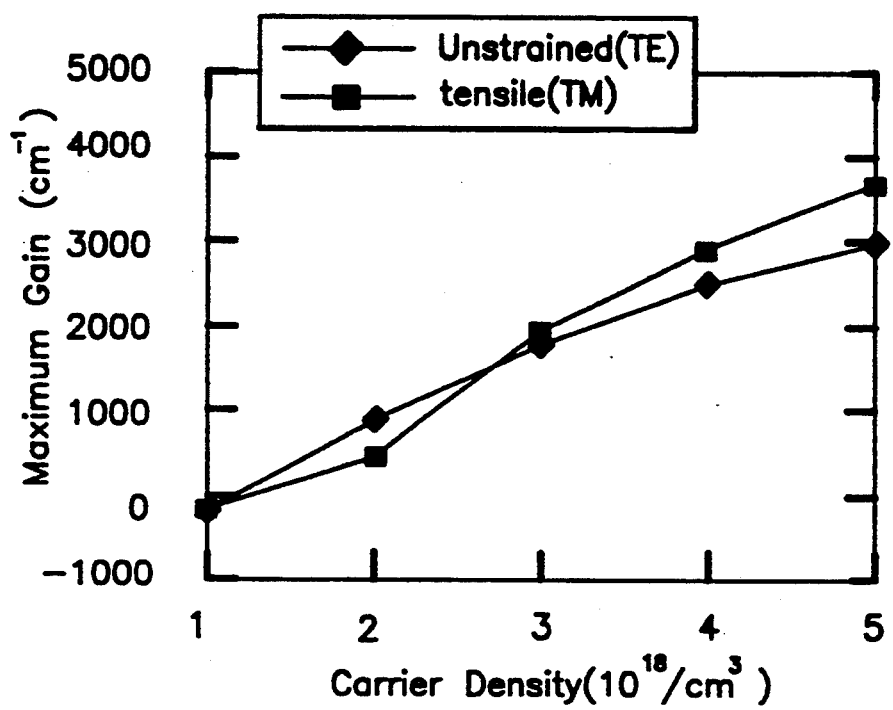
FIG. 5 is a graph showing optical gain variations of TM mode and TE mode, in case that a tensile strained state and an unstrained state are applied to an active layer, respectively.

FIG. 5 is a graph comparing the optic gain according to the carrier density of the semiconductor laser diode upon the unstrained state with the optic gain according to the carrier density of the semiconductor laser diode upon the tensile-strained state.

In a case that the optic gain according to the carrier density is increased in the unstrained state, the semiconductor laser diode acts in a Transverse Electric (TE) mode.

In a case that the optic gain accordings to the carrier density is increased in the tensile-strained state, on the other hand, the semiconductor laser diode acts in a Transverse Magnetic(TM) mode.

Referring to FIG. 5, accordingly, the optic gain of the semiconductor laser diode made of the quantum well having the tensile-strained state is increased, thereby the semiconductor laser diode acts in the TM mode.

Figure 6:
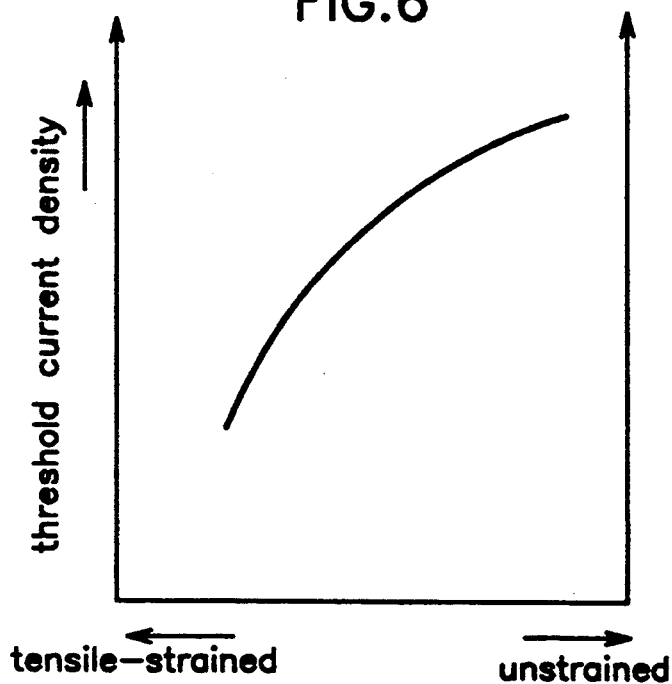
FIG. 6 is a graph showing a threshold current density, in case that a tensile strain is applied to an active layer.

FIG. 6 is a graph showing the threshold current density in the tensile-strained state and the threshold current density in the unstrained state.

As shown in FIG. 5, the semiconductor laser diode having the quantum well layer of tensile-strained state has a larger optic gain than that of the semiconductor laser diode having the quantum well layer of unstrained state.

Accordingly, the threshold current density is lowered, thereby causing the operating current of laser diode to be lowered. The present invention provides the following effects.

First, according to the semiconductor laser diode of the present invention, the active layer is formed into a quantum well layer having the tensile-strained state and the interval between atom in the active layer is shorter than that of the clad layers, thereby to increase the energy band gap.

Accordingly, the oscillation wave length of laser can be shortened although InGaP is used in place of InGaP, as a compound semiconductor for the active layer.

As the wave length of laser is shortened, the quantity of information to be recordable is an optic-magnetic disc in increased.

Second, an optic gain is increased in accordance with the carrier density since the tensile-strained state is applied to the active layer. Accordingly, the semiconductor laser diode acts in the TM mode.

Third, the threshold current density is lowered as the optic gain is increased.

Accordingly, the operation current of the laser diode is lowered, thereby enabling the heat characteristic to be improved.

What is claimed is:
1. A semiconductor laser diode comprising
    a compound semiconductor substrate of a first conductivity type;
    a first compound semiconductor layer of the first conductivity type as a clad layer formed over the semiconductor substrate;
    a second compound semiconductor layer which is undoped to serve as an active layer and formed over the first compound semiconductor layer, the second compound semiconductor layer having a lattice constant different from that of the first compound semiconductor layer such that the active layer is tensile-strained;
    a third compound semiconductor layer of a second conductivity type formed over the second compound semiconductor layer to serve as a clad layer, the third compound semiconductor layer having a lattice constant the same as that of the first compound semiconductor layer;
    a fourth compound semiconductor layer for the first conductivity type as a current confining layer formed over the third compound semiconductor layer having a central region, such that current flows in the central region;
    a fifth compound semiconductor layer of the second conductivity type to serve as a cap layer formed over the fourth compound semiconductor layer;
    a first electrode formed merely over an established central portion of the whole surface of the fifth compound semiconductor layer; and
    a second electrode formed at the lower surface of the compound semiconductor substrate.

2. A semiconductor laser diode in accordance with claim 1, wherein the lattice constant of the second compound semiconductor layer is smaller than that of the first compound semiconductor layer.

3. A semiconductor laser diode in accordance with claim 1, wherein the thickness of the second compound semiconductor layer is 40 Å to 200 Å.

4. A semiconductor laser diode in accordance with claim 1, wherein the second compound semiconductor layer is $In_xGa_{1-x}P$.

5. A semiconductor laser diode in accordance with claim 4, the content x of In is 0.3 to 0.4.

6. A semiconductor laser diode accordance with claim 1, wherein the first compound semiconductor layer and the third compound semiconductor layer have a composition of $In_y(Ga_zAl_{1-z})_{1-y}P$.

7. A semiconductor laser diode in accordance with claim 6, wherein the content y of In is 0.5.

8. A semiconductor laser diode in accordance with claim 6, wherein the content z of Al is 0.3 to 0.7.

9. A semiconductor laser diode in accordance with claim 1, wherein the central region is formed by etching away the fourth compound semiconductor layer vertically in the growth direction to form a cavity and by filling the cavity with the fifth compound semiconductor layer, such that the current in the central region flows parallel to the direction in which the layers are formed.

10. A semiconductor laser diode in accordance with claim 1, wherein the thickness of the second compound semiconductor laser is less than or equal to the critical thickness.

* * * * *